United States Patent [19]

Boucher

[11] 3,901,746

[45] Aug. 26, 1975

[54] METHOD AND DEVICE FOR THE DEPOSITION OF DOPED SEMICONDUCTORS

[75] Inventor: Andre Boucher, Sevres, France

[73] Assignee: U.S. Philips Corporation, New York, N.Y.

[22] Filed: Mar. 1, 1971

[21] Appl. No.: 119,489

[30] Foreign Application Priority Data

Feb. 27, 1970 France ............................ 70.07118

[52] U.S. Cl. ............ 148/175; 117/106 A; 117/201; 118/49; 148/174; 252/62.3 GA

[51] Int. Cl. ......... H01l 7/34; H01l 7/36; B01j 17/30

[58] Field of Search ........ 148/175, 174; 117/106 A, 117/201; 252/62.3 GA; 118/49

[56] References Cited

UNITED STATES PATENTS

| | | | |
|---|---|---|---|
| 3,673,011 | 6/1972 | Strull | 148/175 |
| 3,701,682 | 10/1972 | Gartman et al. | 148/175 X |
| 3,716,405 | 2/1973 | Lim | 117/106 A X |

OTHER PUBLICATIONS

Effer, D., "Epitaxial Growth of Doped and Pure Gas in an Open Flow System," J. Electrochem. Soc., Vol. 112, No. 10, Oct., 1965, p. 1020–1025.

Tietjen et al., "Vapor-Phase Growth of Several III–V Compound Semiconductors," R.C.A. Review, Dec., 1970, p. 635–646.

*Primary Examiner*—L. Dewayne Rutledge
*Assistant Examiner*—W. G. Saba
*Attorney, Agent, or Firm*—Frank R. Trifari; Norman N. Spain

[57] ABSTRACT

Method and device for depositing semiconductors by crystal growth on a substrate from the vapour phase through open tubes.

A source of doping impurity is arranged outside the gas flow in which the constituents of the deposit are caused to react, whilst a non-reactive gas flow is applied to the source in the direction of the reactive gas flow so that the diffusion of the reactive vapours is checked by counterflow.

10 Claims, 3 Drawing Figures

INVENTOR.

ANDRE BOUCHER

BY [signature]

AGENT

INVENTOR.
ANDRE BOUCHER
BY
AGENT

METHOD AND DEVICE FOR THE DEPOSITION OF DOPED SEMICONDUCTORS

This invention relates to a method of depositing a doped semiconductor material by crystal growth on a substrate, in which vapours containing the constituents of said material and given doping impurities are caused to react in a stream of carrying gas directed to said substrate.

This invention also relates to a device for carrying out said method.

In known methods deposition by crystal growth on a substrate and particularly in methods of deposition of epitaxial layers of semiconductor materials reactive vapours containing the elements(s) of the material to be deposited are directed by means of a carrier gas steam to a substrate heated at a given temperature, which is lower than that of the reactive vapours. These growing methods, so-called vapour-phase methods using open tubes permit of obtaining high quality depositions, but they have to be completed by doping operations when the deposited layers have to exhibit uniformly or locally predetermined concentrations of charge carriers. For such a doping an impurity of the donor type or of the acceptor type is introduced into the material during the deposition to a given percentage.

Some semiconductor devices, for example, Gunn effect diodes, variable capacitance diodes require, in addition, that successive layers having different dopant percentages should be deposited on a substrate by means of the same impurity or of different impurities.

Open-tube vapour-deposition methods of known kind have been adapted to these requirements. In particular depositions of gallium arsenide phosphide $GaAs_{1-x}P_x$ doped with selenium or zinc have been made by the method and the device described by Tietjen and Amick in Journal of the Electro-chemical Society of July 1966, page 724. In this method the dopant is conveyed into the region of deposition by means of a carrier gas either in the form of a volatile element evaporated in a side branch of the reaction vessel or in the form of a mixed hydrogen compound in an associated space communicating with a stream of the reactive vapours containing constituents of the deposition and carried along by a carrier gas.

Such a method permits of varying the dopant concentration either by varying the evaporation temperature of the dopant or by varying the supply or the dilution percentage of the hydro-compound. These methods do not permit, however, to carry out instantaneous changes of the dopant concentration, particularly in the case of passing over from a highly doped deposit to a lightly doped deposit. The residual contamination of the walls, the tubes and the chambers, the volume of the mixing space or the thermal inertia of the vapour-pressure device cause the transition between layers of different concentrations not to have the optimum profile. When drawing a curve of the variations in the concentration of charge carriers of a deposit doped by the known methods as a function of the depth in a direction perpendicular to the surface of the deposit, the point O corresponding to the surface S of the substrate, a curve of the type A of FIG. 1 can be obtained: the slopes 1 and 2 demonstrate a delaying effect, the transition from concentration $N_1$ to the concentration $N_2$ or the transition from the concentration $N_2$ to the concentration $N_3$ represent a fairly great thickness of the deposited layer, especially in the case of a transition $N^+/n$.

Moreover, in the device used for carrying out said method the reservoir of the mixture of reactive vapours and the gaseous dopant or the side branch for the evaporation of the volatile element form additional volumes and surfaces likely to increase the undefined risks of contamination and the difficulties of rinsing.

The present invention has for its object to mitigate the drawbacks of the known methods and to permit of obtaining doped deposits with an improved control of the percentage of doping, which percentage in particular can be varied very rapidly in accordance with a predetermined program.

The invention is based on the retro-diffusion or diffusion effect of a gaseous counterflow in a gas stream. If two gases are fed at two different points of the same chamber and evacuated at another point located at a distance beyond the first two points, the diffusion of one of the two gases in the direction of arrival of the other gas can be controlled by means of the flow of the latter without varying its own quantity of flow.

The Applicant has found that it is thus possible to control the chemical attack of a dopant by a reactive gas and the transfer of said dopant, for example, in a zone of the deposit by controlling the flow of a neutral or at least non-reactive gas counteracting the diffusion of said reactive gas, into said dopant.

It is mostly possible to choose reactive gases allowing said attack and transfer as well as the transfer and deposition of at least one element of the material to be deposited.

According to the invention the method of deposition by crystal growth on a substrate of a doped semiconductor material, in which reactive vapours containing the constituents of said material and a given doping impurity are directed by a carrier gas stream to said substrate arranged in a reaction vessel is characterized in that a source of said impurity in the solid or liquid phase with negligible vapour tension is arranged in said reaction vessel outside the reactive vein conveyed by said gas steam, whilst a controllable flow of gas not reacting with said source is directed to said source and in the direction of said reactive vein.

The reactive gases fed into the vessel for the deposition reaction by the carrier gas form a gas vein in a direction substantially determined by the inlet and outlet points between which the substrate is arranged and tend at the same time to diffuse throughout the total volume of the vessel.

According to the invention this diffusion of the reactive gases is utilized for deriving by chemical attack from said source a quantity of impurity which can be controlled by limiting said diffusion by means of the flow of non-reactive gas. Thus on the one hand the diffusion of reactive gas is limited in the vessel to a minimum volume and on the other hand the diffusion of the impurity is also limited to the minimum quantity required. No additional vessel is associated with the vessel so that the risk of contamination is not increased. The residual contaminations and the delaying effect are minimized. The predetermined variations of the doping percentage can be obtained with a constant reactive vapour flow. A simple control of the non-reactive gas flow without interruption of the deposition process permits of changing over from a poorly doped layer to a more highly doped layer or conversely, whilst the curve of the variations in concentration of charge carriers as a function of the thickness in a direction perpendicular to the surface of the deposit has the desired slope and shape, if required with a very steep front. For example, it is possible to obtain a profile of the type of curve B in FIG. 1. The slopes 3 and 4 of this curve, in comparison with the slopes 1 and 2 of a curve A obtained by the known methods of the vapour phase in open tubes, show that the delaying effect is considerably reduced with respect to the known methods. The transition from the concentration $N_1$ to the concentration $N_2$ and the transition from the concentration $N_2$ to the concentration $N_3$ represent very small thicknesses of the deposited layers.

The doping percentage can be readily programmed and multi-layer structures having charge carrier concentrations varying continuously, stepwise or alternatively or in any desired combined way are combined by the control of the flow of non-reactive gas governing the retrodiffusion of the reactive vapours and hence the transfer of dopant to the layer being deposited in a substantially instantaneous and reproducible manner.

The quantity of the source of impurity, the temperature of the same and of the non-reactive gas are not critical and the method ensures a satisfactory reproducibility without particular precautions, provided the vapour tension of the dopant is negligible at the temperature of the source.

In a preferred form of the method embodying the invention the controllable flow of non reactive gas used for limiting the diffusion of reactive vapours towards the source of dopant is employed as a carrier gas flow.

In this way the number of required gas ducts is reduced, as well as the risk of contamination by residual impurities which may be carried along by the gas and the reproducibility is improved.

In an advantageous form of the method embodying the invention the deposit is epitaxial and obtained on a single-crystal substrate.

The invention may be used with advantage for obtaining epitaxial deposits of semiconductor compounds III–V containing at least one element of the group III of the Periodical System of Elements and at least one element of the group V.

The constituents of the compound are fed into the reaction zone and the deposit by means of oxidizing vapours, which may be the same as the vapours used in the known methods, for example, water vapour or a halogen or a hydrohalide. The non-reactive carrier gas is preferably hydrogen.

The source of doping impurity is chosen among the elements have a negligible vapour tension, at least at the temperature of the part of the vessel containing this source and being likely to be attacked at the same temperature by said oxidizing vapours.

For example, in the case of epitaxial gallium arsenide deposits by the arsine or trichloride method, the dopant is chosen among the elements providing the desired conductivity type, for example, tin providing n-type conductivity, chromium, a compensation dopant. The dopant disposed in powdery form outside the trajectory of the halogen vapours carried by hydrogen is, however, attacked by these vapours due to the retrodiffusion. The latter is checked by a hydrogen stream directed to said dopant, the direction being such that the resultant products are carried into the zone of the deposition.

The invention permits of carrying out a doping process with a plurality of dopants. Some devices require an epitaxial deposit having qualities which can be obtained only by means of two simultaneously introduced dopants.

The impurity source arranged in the reaction vessel in accordance with the present invention may comprise the various dopants.

In a preferred embodiment each dopant is contained in a different source, the various sources being disposed at different distances from the inlet point of the reactive vapours varying with the desired percentages of doping.

In most embodiments of the invention the reactive vapours used for the transfer of a slightly volatile component serve for the transfer of the dopant. For example, the hydrochloride obtained from arsenic trichloride used for reacting on the gallium in the co-called trichloride method of depositing gallium arsenide is simultaneously employed in the method according to the invention for reacting on the dopant, for example, tin, which is conveyed into the deposition region in the form of the chloride. In some particular cases the dopant may be transported by another reactive gas than that used for the transfer of the components, this other reactive gas being injected into the vessel substantially at the same point as the gas vein for the component transfer and in the same direction, so that it attains the dopant source by the retrodiffusion effect.

The deposition may be achieved in a reactor formed by a horizontal, air-tight tube. The reactive vapours are introduced by a duct opening out in the central part and are guided in the direction of the axis of the reactor and a non-reactive gas is conveyed by a duct opening out at one end and directed in the direction of said axis. The impurity source is placed in the stream of non-reactive gas in front of the injection point of reactive vapours and at a given distance from this injection point. The position of the dopant source has to be determined in accordance with the shape and the dimensions of the reaction vessel. For example, in a tubular vessel of a diameter of about 3 cms. the distance between the dopant source and the adjacent inlet of the reactive vapours has a magnitude from one to ten times the diameter.

The present invention furthermore relates to a device for carrying out the method set out above. This device comprises mainly a vitrious silica tube in horizontal position having at one end a substrate supporting rod and a gas outlet duct and at the other end a first tubing opening out inside the vessel in a central region at high temperature, into which an etching gas may be introduced, a second tubing opening out in the neighbourhood of the former and conveying reactive vapours, and, as the case may be, a diluting gas, and a third tubing opening out nearer the other end, the opening of which is directed to the central region for conveying a non-reactive gas. A trough containing the dopant in a liquid or solid state is disposed between the opening of the third tubing and that of the second tubing at a distance from the latter which is at least equal to the diameter of the vessel.

The following description will show how the invention may be carried into effect.

Figure 2:
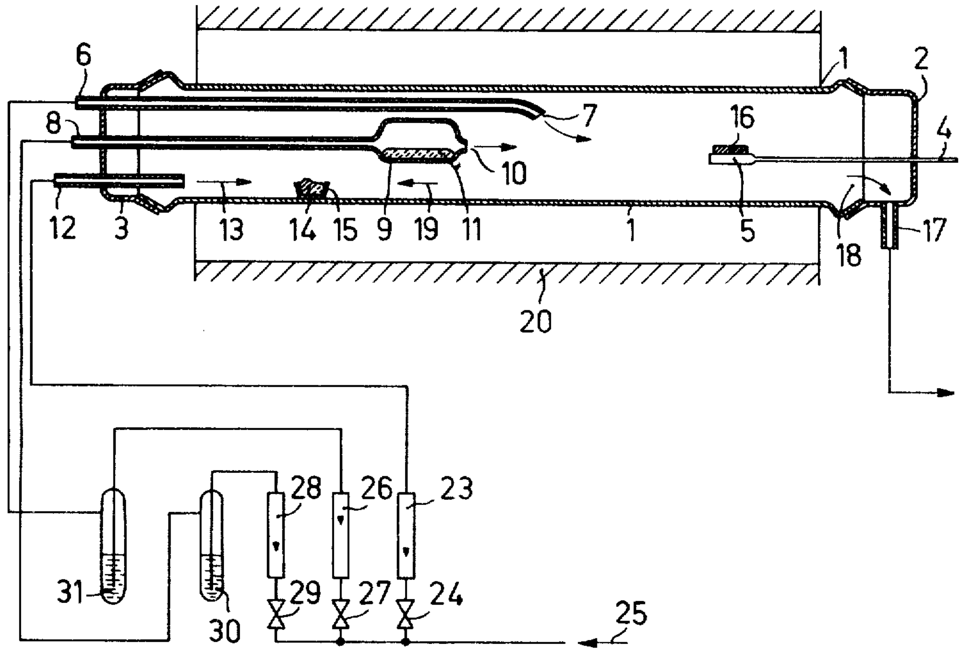
FIG. 2 is a schematic sectional view of the device for carrying out the method according to the invention.

As a matter of course the dimensions and the ratios of the device shown in FIG. 2 are not taken into consideration on the drawing. The dimensions in the direction of the axis of th device in particular have been strongly reduced.

The device shown schematically in FIG. 2 is an example of a means for carrying out the invention in the case of a compound III–V, for example, gallium arsenide. It comprises a horizontal tube 1, preferably of transparent vitrious silica, closed at both ends by polished plugs 2, 3. Through the plug 2 is passed a rod 4 having at its end a substrate supporting plate 5, on which the wafer(s) 16 to be provided with the deposit. Through the plug 3 is passed a first tube 6 opening out at 7 inside the tube 1, the opening being preferably directed towards the substrate 16, whilst a second tube 8 opens out at 10, the opening being also directed towards the substrate and a third tube 12 opens out at 13 in the same direction as the latter two, but far away from the second tube opening out at 10. A portion of the tube 8 near the opening is shaped to serve as a receptable 9 for the mass 11 of the least volatile constituent of the material to be deposited, in the case of gallium arsenide, i.e., the gallium.

The tube 6 may serve for feeding an etching gas to the substrate prior to the deposition process proper. Through the tube 8 is passed a reactive gas, which may be diluted by a carrier gas forming the most volatile constituent of the material to be deposited, for example, an arsenic trihalide in the case of gallium arsenide. Through the tube 12 is passed a non-reactive gas, for example hydrogen. This non-reactive gas is directed to a receptable 15 containing a small quantity 14 of dopant. The plug 2 has furthermore a tube 17 for evacuating the gas arriving at the region 18.

The tube 1 is placed in a furnace 20 having a plurality of zones. The various zones are regulated for at least maintaining on the one hand the receptacles 9 containing the constituent 11 at the desired reaction temperature of about 850°C and for obtaining on the other hand in the region of the substrates 16 the temperature and the gradient required for the growth of the deposit. The conditions of temperatures required in the known methods for obtaining a deposit of good quality with the desired growing rate also apply to the method in accordance with the invention.

In the example described herein a vector non-reactive gas, preferably hydrogen, is fed at 25. A first stream is controlled by a cock 27 and checked at the flow meter 26 and passes into a mixer 31, where it is charged with reactive vapours and it is passed through the tube 6 for etching the substrates 16 prior to the depositing process proper. A second stream controlled by a cock 29 and checked in the flow meter 28 and is passed through a mixer 30 containing an arsenic halide, for example, $AsCl_3$ and is passed through the tube 8 to the gallium contained in the receptacle 9. A third stream controlled by the cock 24 and checked in the flow meter 23 and is passed through the tube 12.

The arsenic halide is dissociated at a sufficiently high temperature on the path to the receptacle 9. The vapours emanating from the opening 10 contain thus a hydrohalide which is capable of attacking the element at 14. According to the invention said third stream is regulated for limiting the retrodiffusion in the direction of the arrow 19 of these reactive vapours entering the tube 1 through the opening 10 and capable of attaining the doping material 14. The attack at the latter is thus checked by handling the control-cock 24 and by reading the flow meter 23. The gas chosen in this case is hydrogen.

Obviously the gas and all materials used are of high quality and very high purity as usually required for deposition processes by the known methods.

Figure 1:
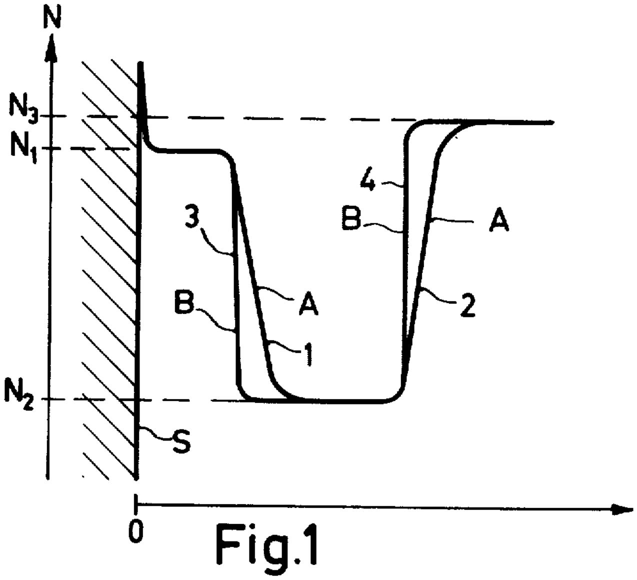
Figure 3:
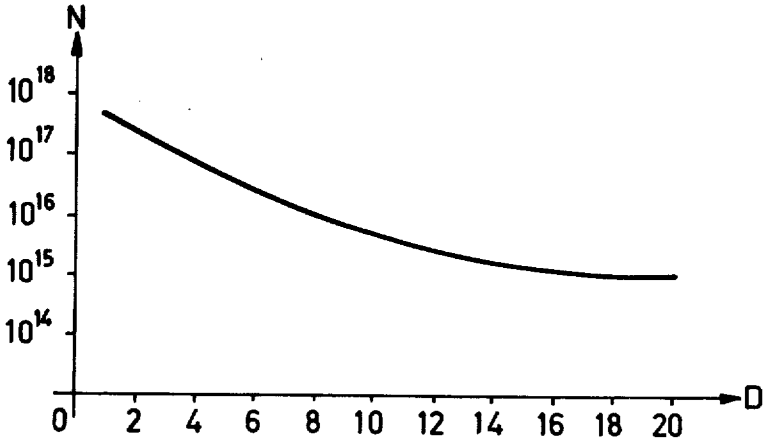
FIG. 3 illustrates a curve of the concentration of charge carriers in a deposit in accordance with a non-reactive gas flow directed to the dopant source in a device embodying the invention.

FIG. 3 illustrates the curve of the charge carrier concentrations N of an epitaxial gallium arsenide deposit on a substrate wafer 16, treated in the device shown in FIG. 2, as a function of the stream D in litres/minute of a non-reactive gas passing through the tube 12, the flow being read from the meter 23, the dopant being tin and the reactive vapours, whose quantities remain constant, diffusing into the tube 1 from the opening 10 and containing mainly hydrochloric acid produced by the dissociated of $AsCl_3$ in hydrogen.

This curve is reproducible and in most cases different values of the temperature of the substance 14 or of the quantity contained in the recipient 15 do not appreciably change the values plotted on the curve. Variations in temperature of the substance 14 will modify the results obtained only in the case in which the reaction of the substance to the reactive vapours depends to a given extent upon said temperature and variations of the quantity used will change the results only when the contact surface of this quantity with the reactive vapours changes to a great extent.

The invention may be applied to any vapor-phase deposition processes by transport through an open tube, which requires an addition of dopant in a very low, predetermined concentration or in a concentration varying with the thickness of the deposit, which addition is performed by means of a body of negligible vapour tension at temperatures approaching the temperature of the transfer reaction.

The invention may particularly be applied to any epitaxial deposition process of semiconductor compounds III-V, especially gallium arsenide. It is particularly used with advantage in the manufacture of semiconductor devices comprising a stack of layers of different conductivity types or different charge-carrier concentrations, especially the Gunn-effect device having layers of the $n^+$-n-$n^+$ type on $n^+$ -type substrates as well as the epitaxial deposits on semi-insulating substrates or on p-type substrates, the so-called Varactor devices having layers of the $n^+$-n-$p^+$ type and all devices requiring an accurate and immediate check of doping during crystal growth.

What is claimed is:

1. In a method of depositing a doped semiconductor material by crystal growth on a substrate by causing reactive vapors containing the constituents of said semiconductor material and a given doping impurity, obtained from a dopant source, to be directed by a stream of a carrier gas to a substrate arranged in a reaction vessel, the improvement wherein the source of said doping impurity has a negligible vapor pressure at a temperature determined by its location in the reaction vessel during the deposition, said source is positioned upstream with respect to the inlet of reactive vapors in said vessel, said reactive vapors reach the dopant source by retrodiffusion and the inlet of non-reactive gas is positioned upstream from the dopant source while a controllable flow of non-reactive gas for said source is directed thereto and in the direction of said reactive gas vein.

2. A method as claimed in claim 1, characterized in that said controllable flow of non-reactive gas limiting the diffusion of the reactive vapours towards said source of impurities is used as a carrier gas stream.

3. A method as claimed in claim 2, characterized in that the gas forming the reactive vapours fed into said vessel for the deposition reaction are reactive for said source.

4. A method as claimed in claim 3 characterized in that said deposit is epitaxial and achieved on a single-crystal substrate and in that said material comprises at least one element of the group III of the Periodical System of Elements and at least one element of the group V.

5. A method as claimed in claim 4, characterized in that said material is gallium arsenide.

6. A method as claimed in claim 5, characterized in that the doping impurity is tin.

7. A method as claimed in claim 6, characterized in that said reactive vapours contain halides.

8. A method as claimed in claim 7 characterized in that the non-reactive gas is hydrogen.

9. A method as claimed in claim 1 characterized in that a second dopant is simultaneously added with the first dopant, the source of this second dopant being different from said first source, each of said sources being disposed at different distances from the inlet point of the reactive vapors, said distances varying with the desired percentages of doping.

10. A method as claimed in claim 1 characterized in that the gases forming said reactive vapors contain a first vapor fed into said vessel for the deposition reaction and non-reactive with said source and a second vapor capable of reacting with said source said second vapor being injected into the vessel substantially at the same point and in the same direction as said first vapor.

* * * * *

UNITED STATES PATENT AND TRADEMARK OFFICE

CERTIFICATE OF CORRECTION

PATENT NO. : 3,901,746

DATED : August 26,1975

INVENTOR(S) : ANDRE BOUCHER

It is certified that error appears in the above-identified patent and that said Letters Patent are hereby corrected as shown below:

Col. 6, line 61, "gas to" should be -- gas, together with said reactive vapors forming a reactive gas vein, to --.

Signed and Sealed this

Twenty-first Day of September 1976

[SEAL]

*Attest:*

RUTH C. MASON
*Attesting Officer*

C. MARSHALL DANN
*Commissioner of Patents and Trademarks*